(12) United States Patent
Latham

(10) Patent No.: US 9,252,294 B2
(45) Date of Patent: Feb. 2, 2016

(54) INSTANTANEOUS SOLAR ARRAY RECOMBINING TECHNOLOGY

(76) Inventor: Andrew V. Latham, Ridgefield, NJ (US)

( * ) Notice: Subject to any disclaimer, the term of this patent is extended or adjusted under 35 U.S.C. 154(b) by 909 days.

(21) Appl. No.: 13/492,186

(22) Filed: Jun. 8, 2012

(65) Prior Publication Data

US 2012/0313455 A1    Dec. 13, 2012

Related U.S. Application Data

(60) Provisional application No. 61/494,580, filed on Jun. 8, 2011.

(51) Int. Cl.
*H02J 1/00* (2006.01)
*H01L 31/02* (2006.01)
*H01L 31/05* (2014.01)
*H02S 40/34* (2014.01)

(52) U.S. Cl.
CPC ...... *H01L 31/02021* (2013.01); *H01L 31/0504* (2013.01); *H02S 40/34* (2014.12); *Y02E 10/50* (2013.01); *Y10T 307/773* (2015.04); *Y10T 307/826* (2015.04); *Y10T 307/832* (2015.04); *Y10T 307/858* (2015.04); *Y10T 307/865* (2015.04)

(58) Field of Classification Search
CPC ..................................... H02J 1/00; H02J 3/00
USPC ........................................................... 307/77
See application file for complete search history.

(56) References Cited

U.S. PATENT DOCUMENTS

| | | | | |
|---|---|---|---|---|
| 6,060,790 A | * | 5/2000 | Craig, Jr. .............. | H02J 7/0024 307/71 |
| 7,969,133 B2 | * | 6/2011 | Zhang ...................... | G05F 1/67 323/283 |
| 2008/0084178 A1 | * | 4/2008 | Dowd ................... | H01M 10/42 320/101 |
| 2012/0112557 A1 | * | 5/2012 | Sager ................ | H01L 31/02021 307/112 |

* cited by examiner

*Primary Examiner* — Rexford Barnie
*Assistant Examiner* — Joseph Inge
(74) *Attorney, Agent, or Firm* — Lowenstein Sandler LLP; Raymond G. Cappo

(57) ABSTRACT

An automatically re-configurable solar array apparatus is disclosed. The apparatus includes a solar array electrically connected to an inverter through a power switch controlled by a microprocessor. The solar array comprises a combination of solar panel strings wired in parallel. Each solar panel string comprises a plurality of solar panels wired in series. An output electrical parameter level of the combination of solar panel strings is capable of producing output power from the inverter. The output electrical parameter level of the combination of solar panel strings is equal to about a predetermined electrical parameter level under sunny conditions. The solar array is pre-wired to permit microprocessor-controlled switching to reconfigure the array into solar panel strings of varying lengths. The electrical parameter level is at least one of a voltage level, a current level, and a power level.

19 Claims, 8 Drawing Sheets

INSTANTANEOUS SOLAR ARRAY RECOMBINING TECHNOLOGY

CROSS-REFERENCE TO RELATED APPLICATION

This application claims the benefit of U.S. provisional patent application No. 61/494,580 filed Jun. 8, 2011, the disclosure of which is incorporated herein by reference in its entirety.

FIELD OF THE INVENTION

The invention relates generally to power systems. More specifically, the invention relates to a method and system for improving total daily power output of solar arrays.

BACKGROUND OF THE INVENTION

Conventional photo-voltaic solar arrays are comprised of individual solar panels wired in series as strings (i.e., sub-arrays) to attain a selected (i.e., predetermined range of) voltage output. The strings may be wired in parallel to provide a desired current/power (See FIG. 1). These arrays/strings are wired into a combiner box, which comprises a group of disconnects and bus bars.

Both large and small photo-voltaic solar arrays produce power when the sun is shining brightly and at certain (i.e., direct) angles. As the angle of the sun decreases, fewer photons may strike a panel, since oblique angles of incident light cause the photons to spread over a larger area. As a result, power output decreases. Power output also decreases as a result of cloud cover. Unfortunately, there may not be sufficient string voltage and/or current to "push" electricity through an inverter to produce a useable output power. While it is true that the open circuit voltage (OCV) of a solar pane(s)/array may be unaffected by low light periods/shallow sun angles/cloud cover, it is also true that if a load (such as an inverter) is applied, panel and thus string voltage will drop immediately and no output from the inverter would be provided.

As a result, energy production of photo-voltaic solar arrays is lost each day. Sun angle/cloud cover problems lower daily energy production, lower power output, and lower useable power, and hence lower electrical production/revenue. This lost time/energy production may be as much as 15% to 35% per day of energy production.

SUMMARY OF THE INVENTION

The above-described problems are addressed and a technical solution is achieved in the art by providing an automatically re-configurable solar array apparatus and method for operating same. The apparatus includes a solar array electrically connected to an inverter through a power switch controlled by a microprocessor. The solar array comprises a first combination of solar panel strings wired in parallel. Each solar panel string comprises a plurality of solar panels wired in series. An output electrical parameter level of the combination of solar panel strings is capable of producing output power from the inverter. The output electrical parameter level of the combination of solar panel strings is equal to about a predetermined electrical parameter level under sunny conditions. The solar array is pre-wired to permit microprocessor-controlled switching to reconfigure the array into solar panel strings of varying lengths. The electrical parameter level is at least one of a voltage level, a current level, and a power level.

In an embodiment, the microprocessor is configured to monitor the electrical parameter level of the first combination through an electrical parameter level sensing circuit. When the monitored electrical parameter level of the first combination falls below the predetermined electrical parameter level, the microprocessor is configured to re-configure the solar array to a second combination of solar panel strings wired in parallel, where each solar panel string comprises a second number of solar panels wired in series. The output electrical parameter level of the second combination of solar panel strings is equal to about a predetermined electrical parameter level under sunny conditions.

In an embodiment, the number of solar panel strings in the second combination decreases and the number of solar panels wired in series in a solar panel string increases as a function of the degree to which the monitored electrical parameter level decreases. In an embodiment, the number of solar panel strings in the second combination increases and the number of solar panels wired in series in a solar panel string decreases as a function of the degree to which the monitored electrical parameter level increases. The minimum combination is one solar panel string of length greater than or equal to one-half the number of solar panels in the array.

In an embodiment, the microprocessor is further configured to, in response to a further increase in the electrical parameter level, re-configure the solar array with the microprocessor-controlled power switch with a greater number of solar panel strings in a combination, and with a fewer number of solar panels in a solar panel string. The microprocessor may to return the configuration of solar panels to a pre-configured state if the monitored electrical parameter level is equal to about the predetermined electrical parameter level.

In an embodiment, the microprocessor may be further configured to identify patterns of a total output electrical parameter level measured by an electrical parameter level sensing circuit to sunlight level patterns measured by a photo-detection circuit to identify solar panel string configurations. The microprocessor may identify patterns of a total output electrical parameter level measured by an electrical parameter level sensing circuit to calculate an expected total output electrical parameter level to identify anomalies in the solar array. The microprocessor may report the anomalies to a power company or third party monitoring company over a wired or wireless connection. The microprocessor may identify no or low levels of the electrical parameter level measured by an associated electrical parameter level sensing circuit of each of the solar panel strings to locate individual panels that have stopped producing power or to locate solar panel strings that have damaged wiring. The microprocessor may report a location of individual solar panels that have stopped producing power or solar panel strings that have damaged wiring to a power company or third party monitoring company over a wired or wireless connection.

In an embodiment, the microprocessor may identify patterns of the electrical parameter level measured by an associated electrical parameter level sensing circuit of each of the solar panel strings to configure solar panel strings into switchable mini-groups of solar panel strings.

In an embodiment, the microprocessor may be further configured to employ the power switch to combine at least a portion of the mini-groups of solar panel strings to raise monitored total output electrical parameter level to be equal to or above the predetermined electrical parameter level.

BRIEF DESCRIPTION OF THE DRAWINGS

The present invention will be more readily understood from the detailed description of exemplary embodiments pre

It is to be understood that the attached drawings are for purposes of illustrating the concepts of the invention and may not be to scale.

DETAILED DESCRIPTION OF THE INVENTION

With conventional solar arrays, a certain amount of energy production during each day is lost to shallow sun angles and cloud cover, since solar panel string voltage is insufficient to drive or push electricity through an inverter and produce usable output current. By installing a sub-panel or special combiner box that includes a microprocessor-controlled power switch and one orm ore voltage and/or current sensing circuits (e.g., hall effect sensors, etc.) and by reconfiguring the some or all of the existing solar sub-arrays/solar panel strings (for both existing and new solar array installations), the total daily power output of existing (footprint and number of solar panels) systems can be improved dramatically.

Figure 1:
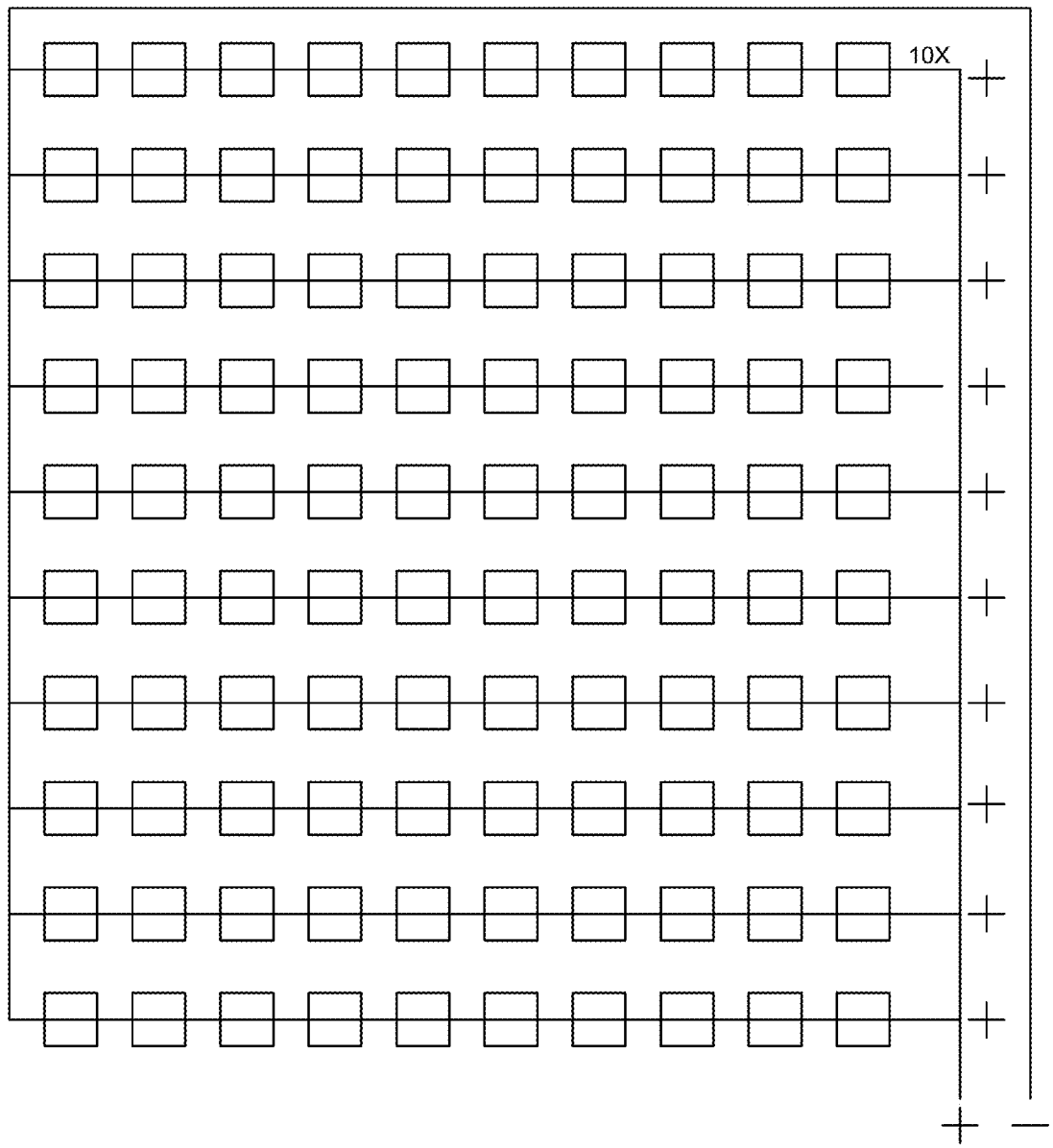
- FIG. 1 is an electrical block diagram of a conventional solar array comprising a hard-wired parallel-series combination of solar panel strings.
Figure 2:
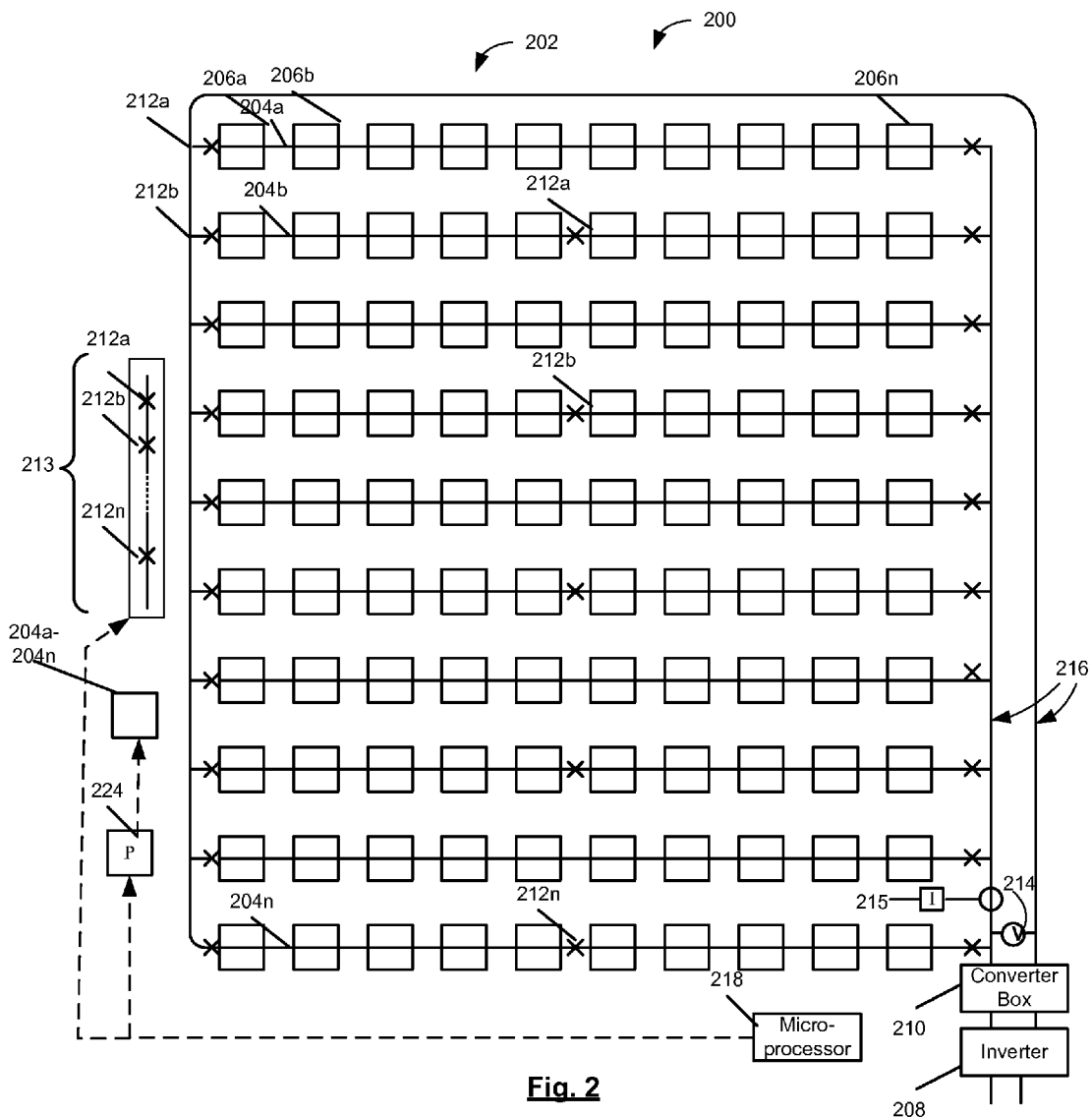
FIG. 2 is an electrical block diagram of one embodiment of an automatically re-configurable solar array apparatus.

FIG. 2 is an electrical block diagram of automatically re-configurable solar array apparatus 200 comprising a wired solar array 202 of solar panel strings 204a-204n, according to an embodiment of the present invention. In an embodiment, a solar panel string (e.g., 204a of 204a-204n) may comprise a plurality of solar panels 206a-206n wired in series to increase total output voltage of the solar array 202. Each of the plurality of solar panel strings 204a-204n may be initially wired in parallel to increase the current/voltage/power output of the solar array 202. The pre-wired solar array 202 may be coupled to an inverter 208 which is configured to receive a DC total output voltage/current of the solar array 202.

The inverter 202 is configured to receive the DC total output voltage/current of the solar array 202 from a combiner box 210 and is configured to convert the DC total output voltage/current to drive into the grid or ac devices. For the inverter 208 to operate properly, there is a maximum and minimum amount of input voltage/current/power (dc) required to create an output voltage/current/power (ac).

At shallow sun angles, there is reduced output voltage/current per solar panel. With a hardwired solar panel string (wherein total dc voltage/current is insufficiently produced), there may be insufficient voltage or current pushed into the inverter 208; therefore, no output voltage or current (power) flows from the inverter 208. At shallow sun angles or during cloud cover, the solar panel wiring is theoretically incorrect and total dc output voltage/current of the solar array is less than a predetermined input voltage/current to the inverter 208 for producing an output voltage/current (power) from the inverter 208; therefore, no inverter output current flows.

In an embodiment, a sufficient number of solar panel strings 204a-204n of solar panels 206a-206n may be initially pre-configured in the series/parallel configuration described above via a plurality of switches 212a-212n that comprise a power switch 213 coupled to the plurality of solar panel strings 204a-204n so that, in direct sunlight with little or now cloud cover, the total output voltage/current of the solar array 202 may be greater than the predetermined voltage/current for producing an output current/voltage/power from the inverter 208.

A voltage sensor 214 may be placed in signal communication with an output 216 of the plurality of solar panel strings 204a-204n for monitoring the total output voltage of the solar array 202. A current sensor 215 may be placed in signal communication with the output 216 of the plurality of solar panel strings 204a-204n for monitoring the total output current of the solar array 202. A microprocessor 218 in signal communication with the power switch 213 and the voltage sensor 214/current sensor 215 may be employed to combine certain solar panel strings 204a-204n with portions of other solar panel strings 204a-204n to produce a parallel-series combinations of fewer solar panel strings of longer string length (i.e., of a greater number of solar panels 206a-206n in series) to increase the monitored total output voltage/current to be equal to or above the predetermined voltage/current when the monitored total output voltage/current falls below the predetermined voltage/current due to obliquely-angled sunlight relative to the solar array apparatus 200 to cloud cover, or any other reason.

Figure 3:
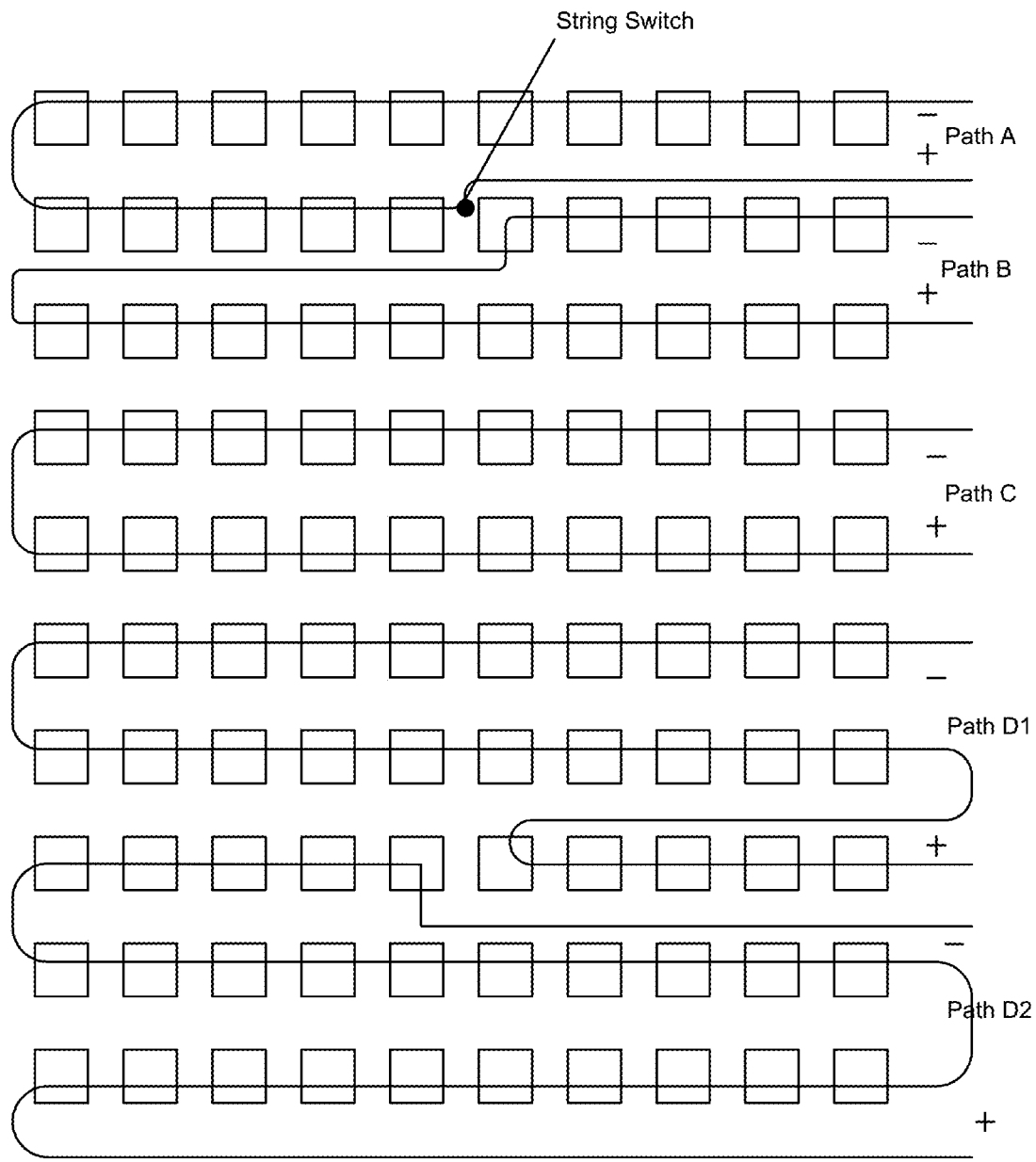
FIGS. 3, 4, and 5 depict various combinations of the solar panel strings and sub-strings of FIG. 2 to permit sufficient string voltage to power the inverter.
Figure 4:
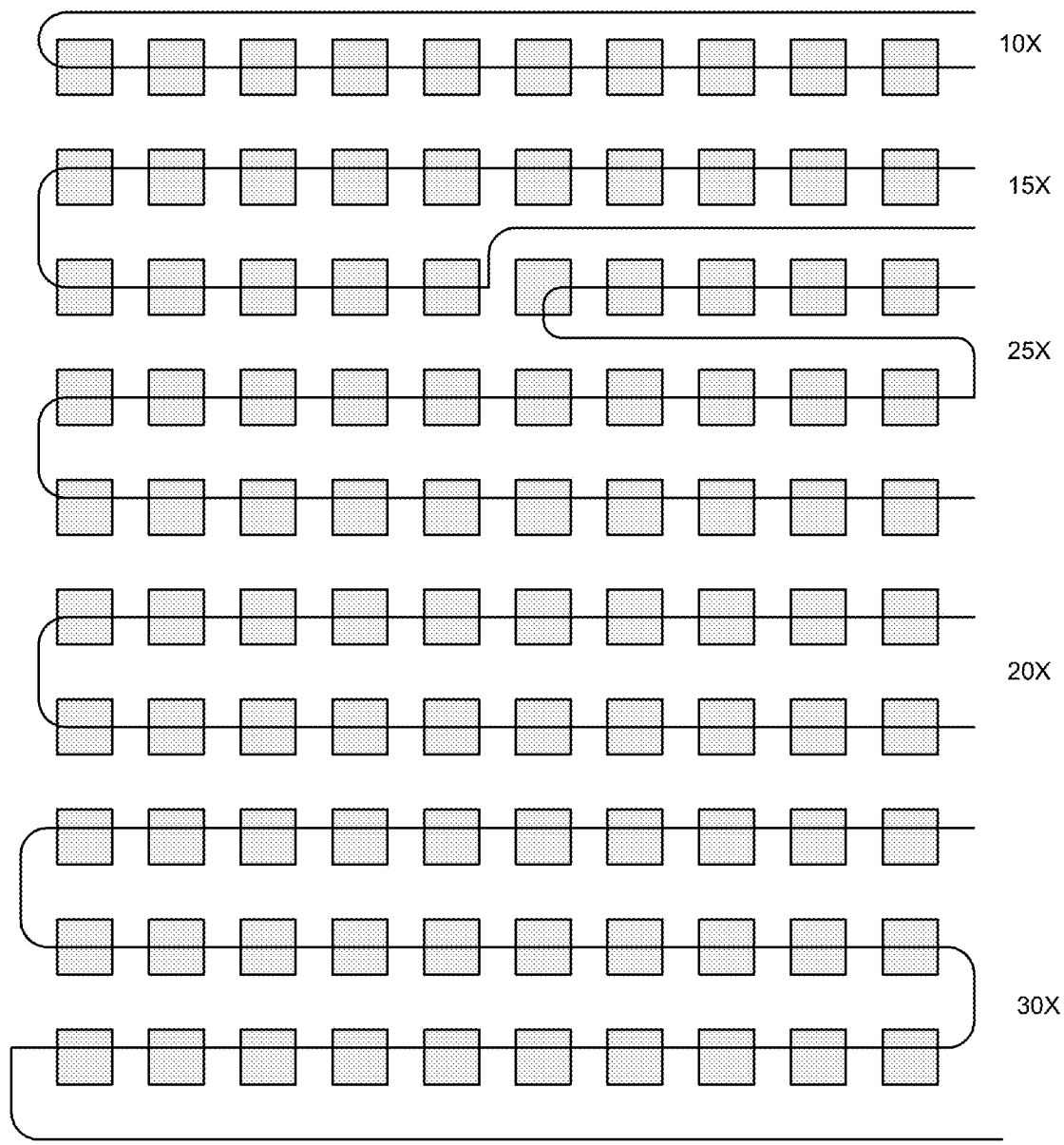
Figure 5:
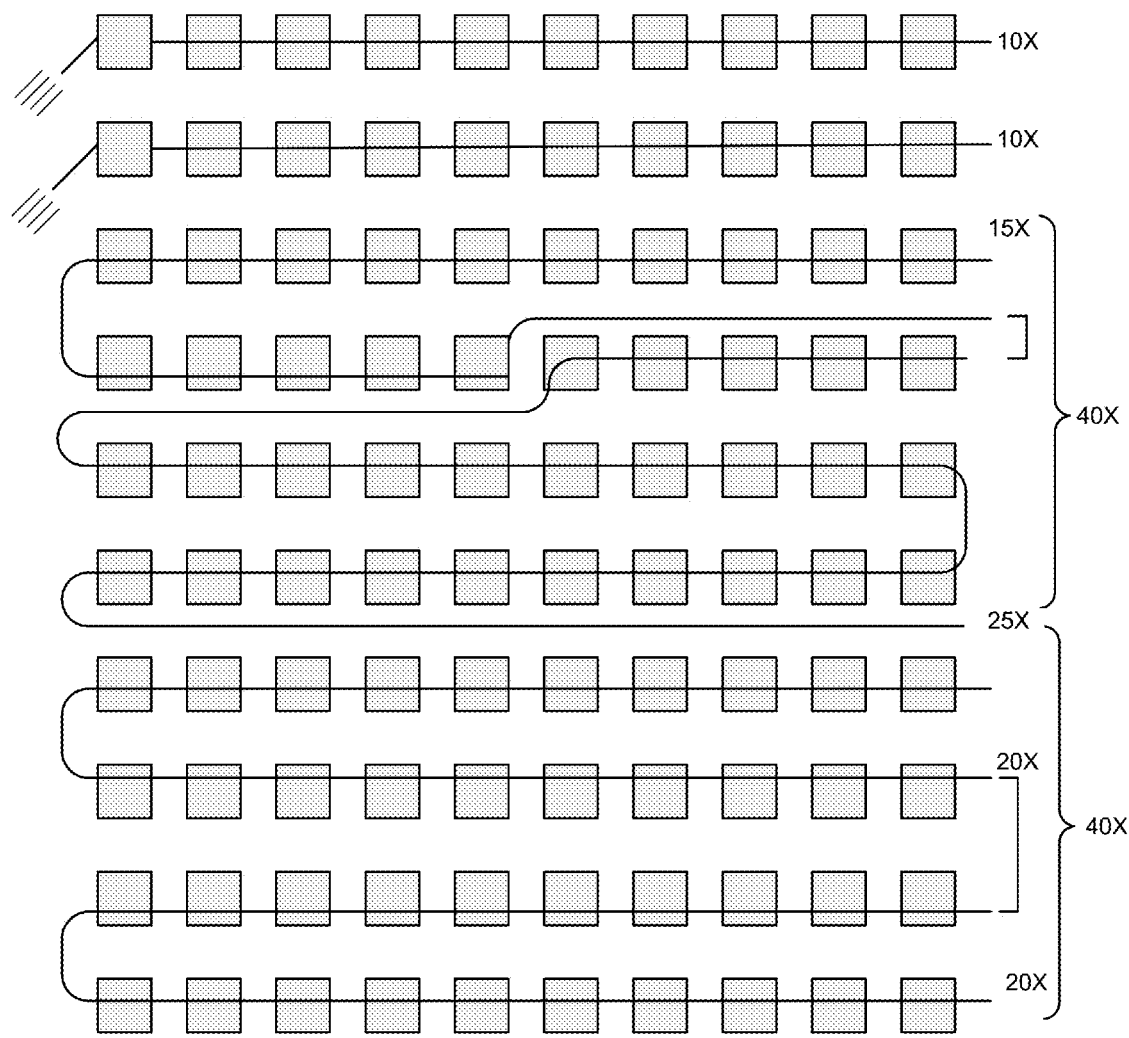

Even if the output of the combiner box 210 is employed to provide pure flat wave dc output (very rare), automated re-configuration of the solar array 202 under microprocessor control of the power switch 213 may still provide usable energy. Referring now to FIGS. 3-5, by having the solar panels 206a-206n wired so that they may be recombined into different solar panel string configurations of differing number of the solar panels 206a-206n connected in series and parallel, sufficient string voltage/current output can be maintained and output power produced from the inverter 208. This instantaneous re-configuration can produce power in almost non-existent light. Theoretically, in large arrays, thousands of solar panels even moon light or ambient light if reconfigured into extremely long string lengths the inverter 208 may produce some current flow.

Thus, returning again to FIG. 2, the microprocessor 218 may be programmed to employ the power switch 213 to combine certain solar panel strings 204a-204n with portions of other solar panel strings 204a-204n to produce a parallel-series combination of fewer solar panel strings of longer string length in response to cloud cover or to shallower angle of incidence of sunlight on the solar array 202. In the limit, the solar array 202 may be configured as a single series-connected string comprising all of the solar panels 206a-206n in the entire solar array 202. Conversely, in subsequent response to a dispersion of cloud cover or increasing of angle of incidence of sunlight on the solar array 202, the microprocessor 218 may be programmed to employ the power switch 213 to combine certain solar panel strings 204a-204n with portions of other solar panel strings 204a-204n to produce a parallel-series combination of a larger number of solar panel strings of shorter string length, (i.e., of a smaller number of solar panels 206a-206n in series) and, in the limit, return the solar array 202 to its initial pre-configured state. This may occur when the total output voltage/current is equal to or above the predetermined voltage/current.

Figure 6:
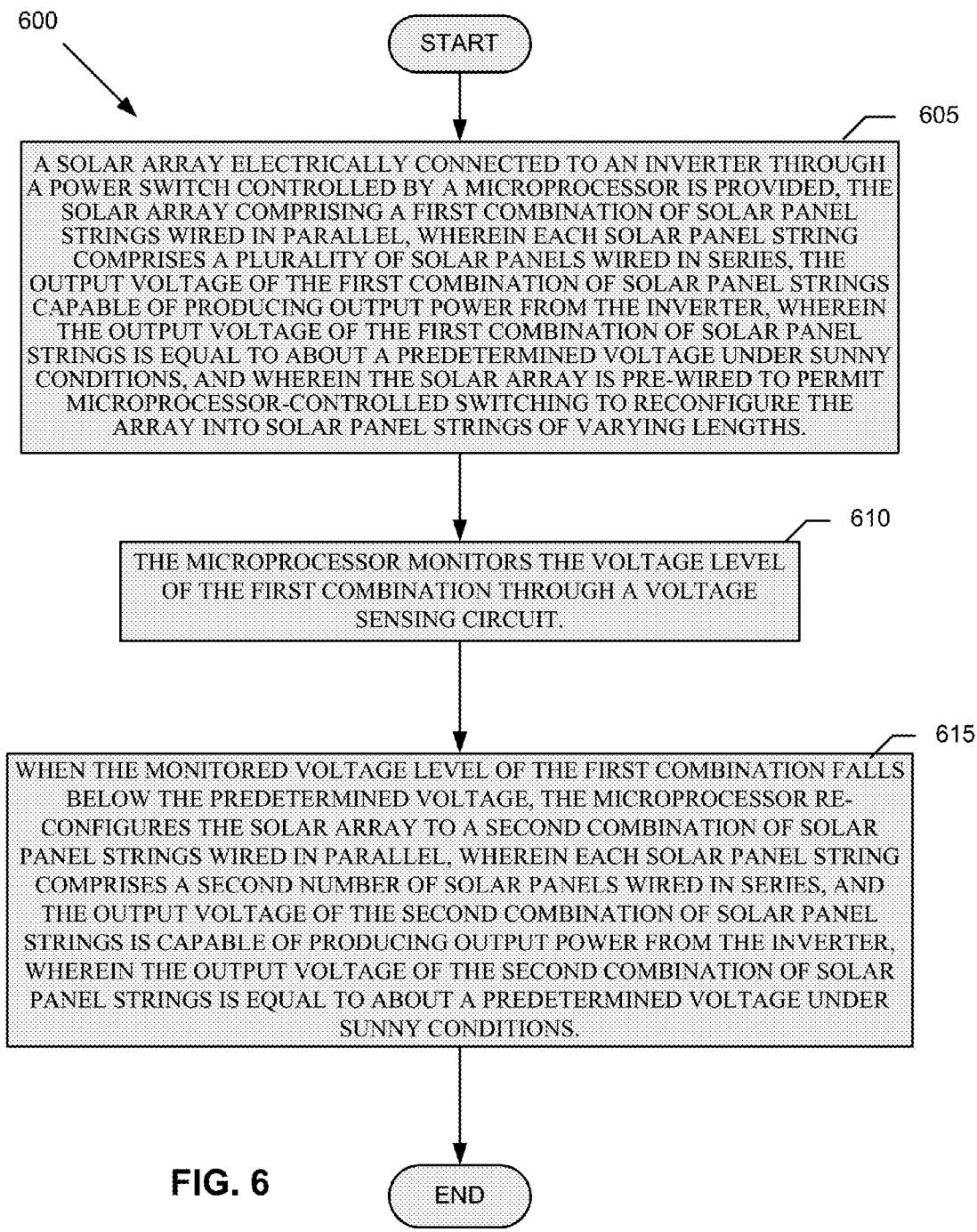
FIG. 6 is flow diagram of one embodiment of method for increasing workable power output of the solar array apparatus of FIG. 2 based on voltage.

FIG. 6 is flow diagram of one embodiment of a method 600 for increasing workable power output of the solar array apparatus 200 of FIG. 2 based on voltage. At block 605, a solar array 202 electrically connected to an inverter 208 through a power switch 213 controlled by a microprocessor 218 is provided. The solar array 213 comprises a first combination of solar panel strings 204a-204n wired in parallel, where each solar panel string comprises a plurality of solar panels 206a-206n wired in series. The output (voltage) 216 of the combination of solar panel strings 204a-204n is capable of producing output power from the inverter 208, wherein the output voltage of the first combination of solar panel strings 204a-204n is equal to about a predetermined voltage under sunny conditions, and where the solar array 202 is pre-wired to permit microprocessor-controlled switching to reconfigure the array 202 into solar panel strings 204a-204n of varying lengths.

At block 610, the microprocessor 218 monitors the voltage level of the first combination through a voltage sensing circuit 214. At block 615, when the monitored voltage level of the first combination falls below the predetermined voltage, the microprocessor 218 re-configures the solar array 202 to a second combination of solar panel strings 204a-204n wired in parallel, where each solar panel string comprises a second number of solar panels 206a-206n wired in series. The output (voltage) of the second combination of solar panel strings 204a-204n is capable of producing output power from the inverter 208, where the output voltage of the second combination of solar panel strings 204a-204n is equal to about the predetermined voltage under sunny conditions.

In an embodiment, the predetermined voltage for producing output current/voltage/power from the inverter 208 may be determined by dividing the required inverter input dc voltage by individual solar panel output voltage, which determines the optimal number of solar panels in series or solar panel string length.

In an embodiment, the number of solar panel strings 204a-204n in the second combination decreases and the number of solar panels 206a-206n wired in series in a solar panel string increases as a function of the degree to which the monitored voltage level decreases. In an embodiment, the number of solar panel strings 204a-204n in the second combination increases and the number of solar panels 206a-206n wired in series in a solar panel string decreases as a function of the degree to which the monitored voltage level increases. The minimum combination is one solar panel string of length greater than or equal to one-half the number of solar panels in the array.

In an embodiment, the microprocessor 218 is further configured to, in response to a further increase in monitored voltage level, re-configure the solar array 202 with the microprocessor-controlled power switch 213 with a greater number of solar panel strings 204a-204n in a combination, and with a fewer number of solar panels 206a-206n in a solar panel string. The microprocessor 218 may to return the configuration of solar panels 206a-206n to a pre-configured state if the monitored voltage level is equal to or above the predetermined voltage.

Figure 7:
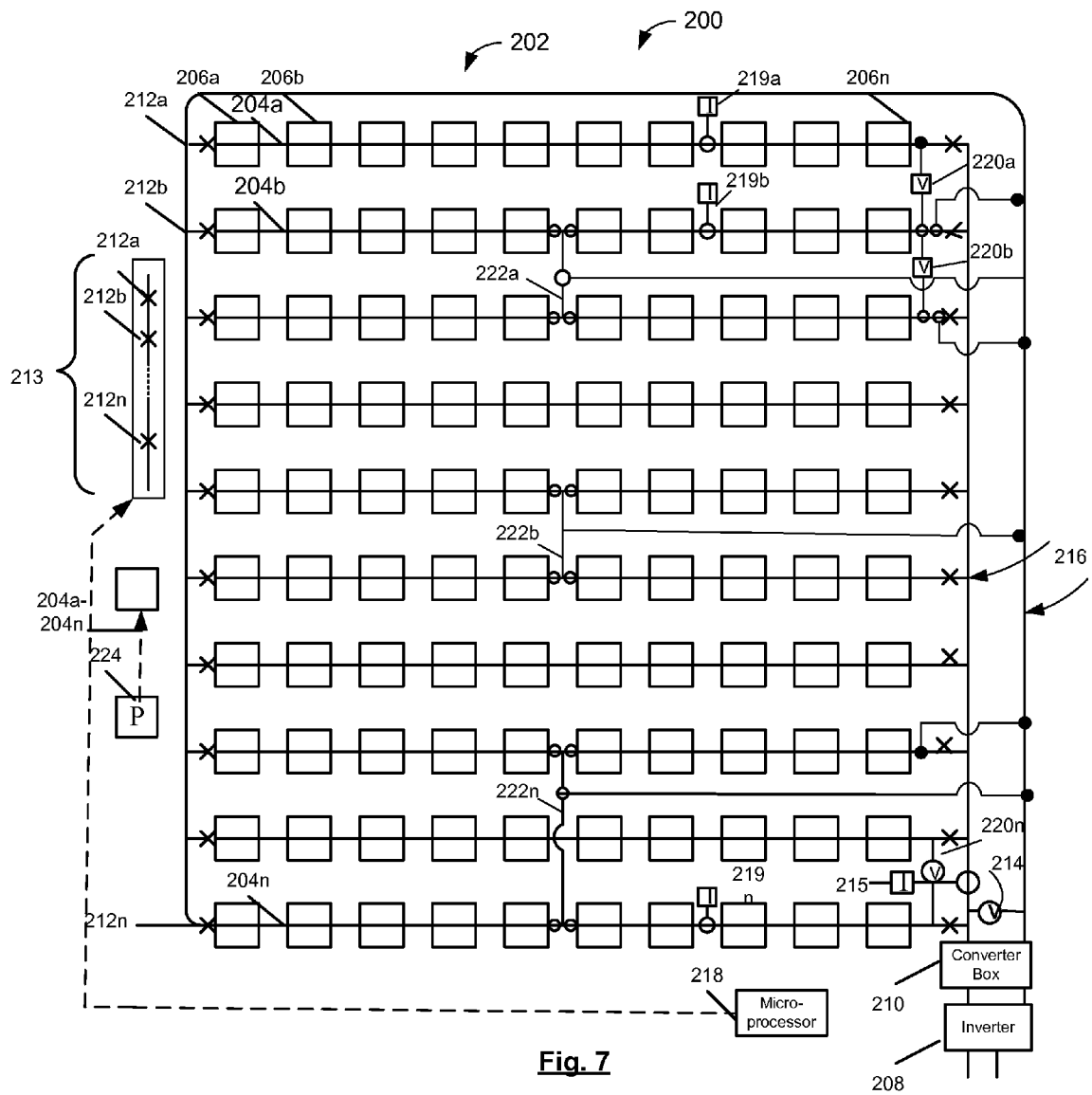
FIG. 7 is an electrical block diagram of another embodiment of an automatically re-configurable solar array apparatus comprising a wired solar array of solar panel strings that further includes a number of switches, voltage sensors, and current sensors located at strategic locations along portions of each of the solar panel strings.

Referring now to FIG. 7, the system 200 of one embodiment of the present invention may further include a number of switches 212a-212n, voltage sensing circuits 220a-220n, current sensing circuits 219a-219n, and one or more photo-detection circuits 224 located at strategic locations along portions of each of the solar panel strings 204a-204n. In FIG. 7, circles 222a-222n represent pathway switches that are controlled by the microprocessor 218 to reconfigure the solar array 202 to maintain string voltage to a maximum by recombining the strings 204a-204n into longer and longer strings as shown in FIGS. 3-5 (e.g., as sun angle decreases or cloud cover is overhead).

In an embodiment, the microprocessor 218 may be further configured to identify patterns of total output voltage measured by the voltage sensing circuit 214 to sunlight level patterns measured by a photo-detection circuit 224 to identify solar panel string configurations to increase the efficiency of the apparatus 200. The microprocessor 218 may be configured to employ the plurality of voltage sensors 120a-120n. The microprocessor 218 may identify patterns of total output voltage measured by the voltage sensing circuit 214 to calculate expected total output voltage to identify anomalies in the solar array 202. The microprocessor 218 may report the anomalies to a power company or third party monitoring company over a wired or wireless connection (not shown).

The microprocessor 218 may identify no or low levels of current measured by an associated one of the current sensing circuits 219a-219n of each of the solar panel strings 204a-204n to locate individual solar panels 206a-206n that have stopped producing power or to locate solar panel strings that have damaged wiring. The microprocessor 218 may report a location of individual solar panels 206a-206n that have stopped producing power or solar panel strings 204a-204n that have damaged wiring to a power company or third party monitoring company over a wired or wireless connection (not shown).

According to an embodiment of the present invention, some solar panel strings 204a-204n may be hard wired but disconnectable and re-combinable at a combiner box bus bar (not shown). Other pre-determined or pre-calculated numbers of strings 204a-204n may be re-configurable into mini-groups of panels or subsets/sub-strings. This may be accomplished with various types of switching, either mechanical or electronic. These mini-groups may be recombined and inserted into hard wired strings at the combiner box 208 to increase string lengths to add to the total output voltage. Then, at even shallower sun angles, some of the hard wired strings 204a-104n may be converted into longer strings 204a-204n by recombining two or more hard wire strings into extremely long strings 204a-204n. Mini-groups may be mixed and in one embodiment, all of the strings 204a-204n may be combined into a super string for moonlight power production.

In an embodiment, the microprocessor 218 may identify patterns of current measured by associated ones of the current sensing circuits 219a-219n of each of the solar panel strings 204a-204n and patterns of output voltage measured by associated voltage sensing circuits 220a-220n to configure solar panel strings 204a-204n into the switchable mini-groups of solar panel strings voltage sensing circuits 220a-220n.

In an embodiment, the microprocessor 218 may be further configured to employ the power switch 213 to combine at least a portion of the mini-groups of solar panel strings 204a-204n to raise monitored total output voltage to be equal to or above the predetermined voltage.

It should be noted that electrical parameter levels of different types may be monitored by a corresponding electrical parameter sensing device and compared to a corresponding predetermined electrical parameter level for determining whether output power may be produced by the inverter 208. Examples of an electrical parameter level may include, but are not limited to, at least one of a voltage level, a current level, and a power level.

For example, referring again to FIG. 2, the current sensor 215 may be employed to monitor the total output current of the solar array 202 to determine a second combination of solar panel strings 204a-204n capable of producing output power from the inverter 208, as would be appreciated by one of ordinary skill in the art having the benefit of this disclosure. In such circumstances, the output current of the first and/or second combination of solar panel strings 204a-204n is equal to about a predetermined current under sunny conditions.

Figure 8:
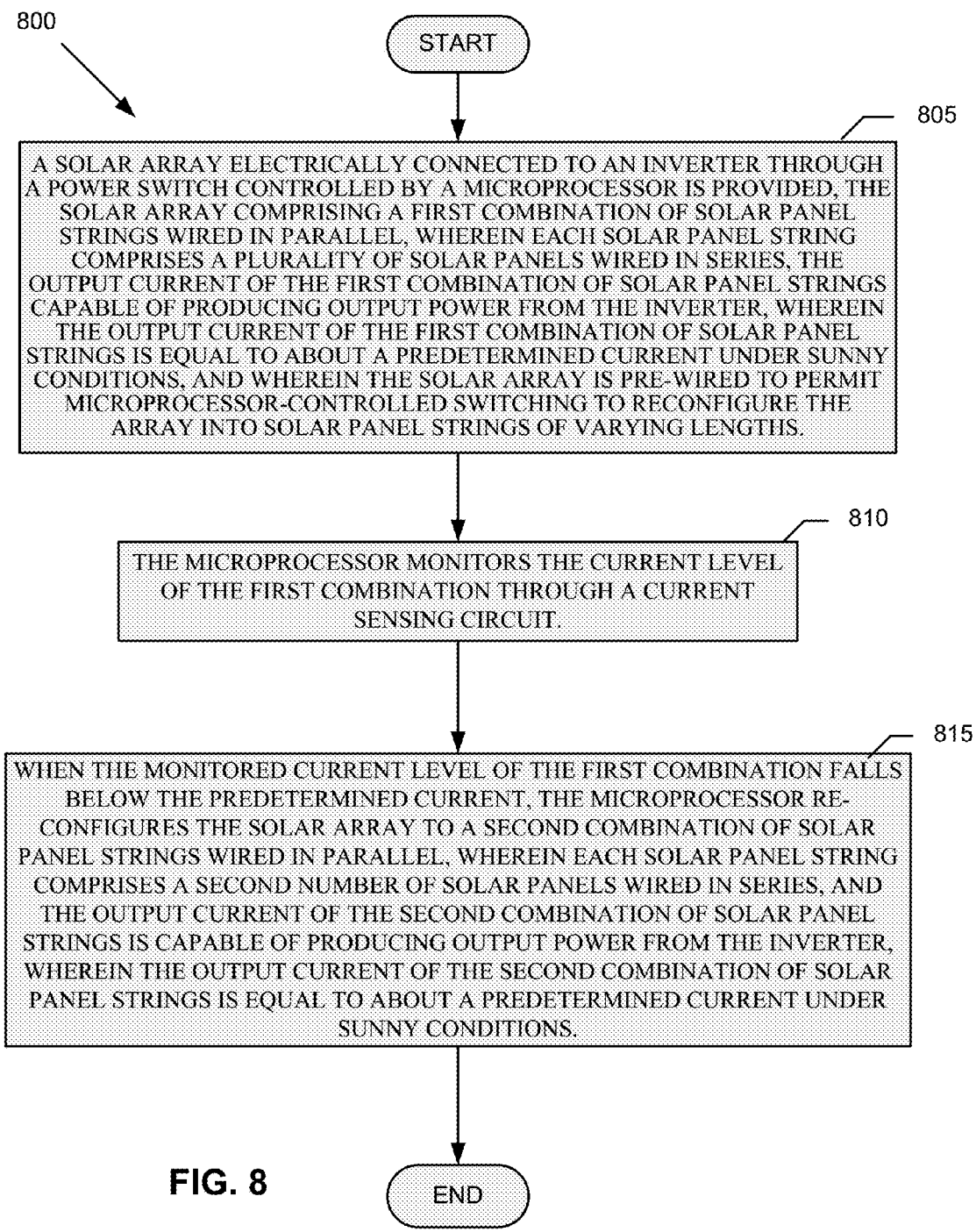
FIG. 8 is flow diagram of another embodiment of a method for increasing workable power output of the solar array apparatus of FIG. 2 based on current.

FIG. 8 is flow diagram of another embodiment of a method 800 for increasing workable power output of the solar array apparatus 200 of FIG. 2 based on current. At block 805, a solar array 202 electrically connected to an inverter 208 through a power switch 213 controlled by a microprocessor 218 is provided. The solar array 213 comprises a first combination of solar panel strings 204a-204n wired in parallel, where each solar panel string comprises a plurality of solar panels 206a-206n wired in series. The output (current) 216 of the combination of solar panel strings 204a-204n is capable of producing output power from the inverter 208, wherein the output current of the first combination of solar panel strings 204a-204n is equal to about a predetermined current under sunny conditions, and where the solar array 202 is pre-wired to permit microprocessor-controlled switching to reconfigure the array 202 into solar panel strings 204a-204n of varying lengths.

At block 810, the microprocessor 218 monitors the current level of the first combination through the current sensing circuit 215. At block 815, when the monitored current level of the first combination falls below the predetermined current level, the microprocessor 218 re-configures the solar array 202 to a second combination of solar panel strings 204a-204n wired in parallel, where each solar panel string comprises a second number of solar panels 206a-206n wired in series. The output (current) of the second combination of solar panel strings 204a-204n is capable of producing output power from the inverter 208, where the output current of the second combination of solar panel strings 204a-204n is equal to about the predetermined current under sunny conditions.

In an embodiment, the number of solar panel strings 204a-204n in the second combination decreases and the number of solar panels 206a-206n wired in series in a solar panel string increases as a function of the degree to which the monitored current level decreases. In an embodiment, the number of solar panel strings 204a-204n in the second combination increases and the number of solar panels 206a-206n wired in series in a solar panel string decreases as a function of the degree to which the monitored current level increases. The minimum combination is one solar panel string of length greater than or equal to one-half the number of solar panels in the array.

In an embodiment, the microprocessor 218 is further configured to, in response to a further increase in monitored current level, re-configure the solar array 202 with the microprocessor-controlled power switch 213 with a greater number of solar panel strings 204a-204n in a combination, and with a fewer number of solar panels 206a-206n in a solar panel string. The microprocessor 218 may to return the configuration of solar panels 206a-206n to a pre-configured state if the monitored current level is equal to or above the predetermined current.

It is to be understood that the above description is intended to be illustrative, and not restrictive. Many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The scope of the invention should, therefore, be determined with reference to the appended claims, along with the full scope of equivalents to which such claims are entitled.

What is claimed is:

1. A method, comprising:
providing a solar array electrically connected to an inverter through a microprocessor-controlled power switch, the solar array comprising a first combination of solar panel strings wired in parallel,
wherein each solar panel string comprises a plurality of solar panels wired in series, an output electrical level of the combination of solar panel strings capable of producing output power from the inverter, wherein an output electrical level of the first combination of solar panel strings is equal to a predetermined electrical parameter level under sunny conditions, and
wherein the solar array is pre-wired to permit microprocessor-controlled switching to reconfigure the array into solar panel strings of varying lengths;
monitoring in a microprocessor the electrical level of the first combination through an electrical level sensing circuit, the first combination of solar panel strings comprising a first combination of one or more switchable mini-groups of hard-wired solar panel strings; and
when the monitored electrical level of the first combination falls below the predetermined electrical parameter level,
re-configuring the solar array by microprocessor control to a second combination of solar panel strings wired in parallel, the second combination of solar panel strings comprising a second combination of the one or more switchable mini-groups of hard-wired solar panel strings, the second combination of the one or more switchable mini-groups having a configuration that combines at least a portion of the first combination of one or more switchable mini-groups of solar panel strings to raise the monitored electrical level of the second combination of solar panel strings to be equal to the predetermined electrical level under sunny conditions,
wherein each solar panel string comprises a second number of solar panels wired in series, and
wherein the output electrical level of the second combination of solar panel strings is capable of producing output power from the inverter.

2. The method of claim 1, wherein the electrical level is at least one of a voltage level, a current level, and a power level.

3. The method of claim 1, wherein the number of solar panel strings in the second combination decreases and the number of solar panels wired in series in a solar panel string increases as the monitored electrical level decreases.

4. The method of claim 3, wherein the number of solar panel strings in the second combination increases and the number of solar panels wired in series in a solar panel string decreases as the monitored electrical level increases.

5. The method of claim 1, wherein the minimum combination is one solar panel string of length equal to one-half the number of solar panels in the array.

6. The method of claim 1, further comprising, in response to a further increase in the monitored electrical level, re-configuring the solar array with the microprocessor-controlled power switch with a greater number of solar panel strings in a combination, and with a fewer number of solar panels in a solar panel string.

7. The method of claim 1, further comprising returning the configuration of solar panels to a pre-configured state if the monitored electrical level is equal to the predetermined electrical level.

8. The method of claim 1, further comprising identifying in the microprocessor patterns of the monitored electrical level measured by a corresponding level sensing circuit to sunlight level patterns measured by a photo-detection circuit to identify solar panel string configurations.

9. The method of claim 1, further comprising identifying in the microprocessor patterns of the monitored electrical level measured by a corresponding level sensing circuit to calculate an expected total output level to identify anomalies in the solar array.

10. The method of claim 9, further comprising reporting the anomalies to a power company or third party monitoring company over a wired or wireless connection.

11. The method of claim 1, further comprising identifying in the microprocessor no or low levels of the monitored electrical level measured by a corresponding parameter level sensing circuit of each of the solar panel strings to locate individual panels that have stopped producing power or to locate solar panel strings that have damaged wiring.

12. The method of claim 11, further comprising reporting a location of individual solar panels that have stopped producing power or solar panel strings that have damaged wiring to a power company or third party monitoring company over a wired or wireless connection.

13. An apparatus, comprising:
a solar array electrically connected to an inverter through a power switch controlled by a microprocessor, the solar array comprising a first combination of solar panel strings wired in parallel,
wherein each solar panel string comprises a plurality of solar panels wired in series, an output electrical level of the first combination of solar panel strings capable of producing output power from the inverter, wherein the output electrical level of the first combination of solar panel strings is equal to a predetermined electrical level under sunny conditions, and
wherein the solar array is pre-wired to permit microprocessor-controlled switching to reconfigure the array into solar panel strings of varying lengths, the microprocessor to:
monitor the electrical level of the first combination through an electrical parameter level sensing circuit, the first combination of solar panel strings comprising a first combination of one or more switchable mini-groups of hard-wired solar panel strings; and
when the monitored electrical level of the first combination falls below the predetermined electrical level,
re-configure the solar array by microprocessor control to a second combination of solar panel strings wired in parallel, the second combination of solar panel strings comprising a second combination of the one or more switchable mini-groups of hard-wired solar panel strings, the second combination of the one or more switchable mini-groups having a configuration that combines at least a portion of the first combination of one or more switchable mini-groups of solar panel strings to raise the monitored electrical level of the second combination of solar panel strings to be equal to the predetermined electrical level under sunny conditions,
wherein each solar panel string comprises a second number of solar panels wired in series, and
wherein the output electrical level of the second combination of solar panel strings is capable of producing output power from the inverter.

14. The system of claim 13, wherein the electrical level is at least one of a voltage level, a current level, and a power level.

15. The system of claim 13, wherein the number of solar panel strings in the second combination decreases and the number of solar panels wired in series in a solar panel string increases as the monitored electrical level decreases.

16. The system of claim 15, wherein the number of solar panel strings in the second combination increases and the number of solar panels wired in series in a solar panel string decreases as the monitored electrical level increases.

17. The system of claim 13, wherein the minimum combination is one solar panel string of length equal to one-half the number of solar panels in the array.

18. The system of claim 13, wherein the microprocessor is further configured to, in response to a further increase in the monitored electrical level, re-configure the solar array with the microprocessor-controlled power switch with a greater number of solar panel strings in a combination, and with a fewer number of solar panels in a solar panel string.

19. The system of claim 18, wherein the microprocessor is further configured to return the configuration of solar panels to a pre-configured state if the monitored electrical level is equal to or above the predetermined electrical level.

* * * * *